US011846017B2

(12) United States Patent
Takahashi et al.

(10) Patent No.: US 11,846,017 B2
(45) Date of Patent: Dec. 19, 2023

(54) HOT FILAMENT CVD DEVICE

(71) Applicant: KABUSHIKI KAISHA KOBE SEIKO SHO (KOBE STEEL, LTD.), Hyogo (JP)

(72) Inventors: Tetsuya Takahashi, Takasago (JP); Satoshi Hirota, Takasago (JP); Rainer Cremer, Monschau (DE)

(73) Assignee: KOBE STEEL, LTD., Hyogo (JP)

( * ) Notice: Subject to any disclaimer, the term of this patent is extended or adjusted under 35 U.S.C. 154(b) by 421 days.

(21) Appl. No.: 17/271,433

(22) PCT Filed: Aug. 19, 2019

(86) PCT No.: PCT/JP2019/032300
§ 371 (c)(1),
(2) Date: Feb. 25, 2021

(87) PCT Pub. No.: WO2020/054326
PCT Pub. Date: Mar. 19, 2020

(65) Prior Publication Data

US 2021/0324511 A1 Oct. 21, 2021

(30) Foreign Application Priority Data

Sep. 10, 2018 (JP) ................................ 2018-168447

(51) Int. Cl.
*C23C 16/27* (2006.01)
*C23C 16/458* (2006.01)

(52) U.S. Cl.
CPC .......... *C23C 16/271* (2013.01); *C23C 16/458* (2013.01)

(58) Field of Classification Search
CPC ............................ C23C 16/458; C23C 16/271
See application file for complete search history.

(56) References Cited

U.S. PATENT DOCUMENTS 5,833,753 A * 11/1998 Herlinger ................ C23C 16/14 118/724
2011/0303145 A1 12/2011 Lee et al.
2011/0305831 A1 12/2011 Lee et al.
2014/0102364 A1 4/2014 Heaney et al.
2019/0071776 A1* 3/2019 Boguslavsky ........ C23C 16/402

FOREIGN PATENT DOCUMENTS

JP H04-006274 A 1/1992
KR 10-2013-0115209 A 10/2013

OTHER PUBLICATIONS

The extended European search report issued by the European Patent Office dated Mar. 3, 2022, which corresponds to European Patent Application No. 19859554.8-1103 and is related to U.S. Appl. No. 17/271,433.

* cited by examiner

*Primary Examiner* — Yuechuan Yu
(74) *Attorney, Agent, or Firm* — Studebaker & Brackett PC

(57) ABSTRACT

Provided is a hot filament CVD device capable of easily attaching, detaching, and replacing a filament. The hot filament CVD device includes a chamber, a base material support that supports multiple base materials, filament cartridges, and paired holding parts. The filament cartridges each include multiple filaments (60), a first frame, a second frame, and paired connecting members. The paired holding parts guide each of the filament cartridges when it is inserted into the chamber, and hold the filament cartridges in the chamber so that the filament cartridges face the multiple base materials.

5 Claims, 18 Drawing Sheets

UP
LEFT
RIGHT
DOWN

UP
LEFT
RIGHT
DOWN

HOT FILAMENT CVD DEVICE

TECHNICAL FIELD

The present invention relates to a hot filament CVD device that forms a coating film on a base material.

BACKGROUND ART

Known examples of a coating device for forming a coating film such as a diamond thin film on a surface of a base material include a hot filament CVD device. In such a hot filament CVD device, a mixed gas of hydrocarbons (methane) and hydrogen is preheated by a filament heated to 1000 degrees or more, and the heated gas is introduced into the surface of the substrate to deposit diamond due to thermal decomposition of the hydrocarbons.

Patent Literature 1 discloses a technique in which a workpiece (base material) is disposed inside a filament wound in a cylindrical shape to deposit a uniform diamond coating film on a surface of the workpiece having a three-dimensional shape. The technique uses a structural member including multiple struts and a beam in the shape of a ring connecting the multiple struts. A single filament is stretched around the struts and the beam of the structural member to form a heating region in a cylindrical shape.

CITATION LIST

Patent Literature

Patent Literature 1: JP H4-6274 A

Patent Literature 1 describes the technique in which when a filament is broken due to repeated coating treatment, the broken filament needs to be removed from the struts and the beam in order, and a new filament needs to be stretched around the struts and the beam. This causes a problem in that working hours increase in attaching, detaching, and replacing a filament in a hot filament CVD device.

SUMMARY OF INVENTION

It is an object of the present invention to provide a hot filament CVD device capable of easily attaching, detaching, and replacing a filament.

The present invention provides a hot filament CVD device that performs coating treatment on multiple base materials. The hot filament CVD device includes: a chamber including a chamber body provided with an opening, and a door attached to the chamber body to seal the opening and allow the opening to be openable; a base material support disposed inside the chamber to support the multiple base materials; at least one filament cartridge insertable into the chamber through the opening in a predetermined insertion direction, the at least one filament cartridge including: multiple filaments that extend in a first direction and are disposed apart from each other in a second direction intersecting the first direction; a first frame that extends in the second direction and supports one end of each of the multiple filaments in the first direction; a second frame that extends in the second direction and supports another end of each of the multiple filaments in the first direction; and paired connecting members that connect opposite ends of the first frame in the second direction and corresponding opposite ends of the second frame in the second direction in the first direction; a power source that allows a current to flow into the multiple filaments; and a paired holding parts each having a shape for guiding the at least one filament cartridge in the insertion direction, the at least one filament cartridge being to be inserted into the chamber in the insertion direction through the opening, and for holding the at least one filament cartridge while allowing the multiple filaments to face the corresponding multiple base materials in a third direction intersecting a plane including the first direction and the second direction.

DESCRIPTION OF EMBODIMENT

Figure 1:
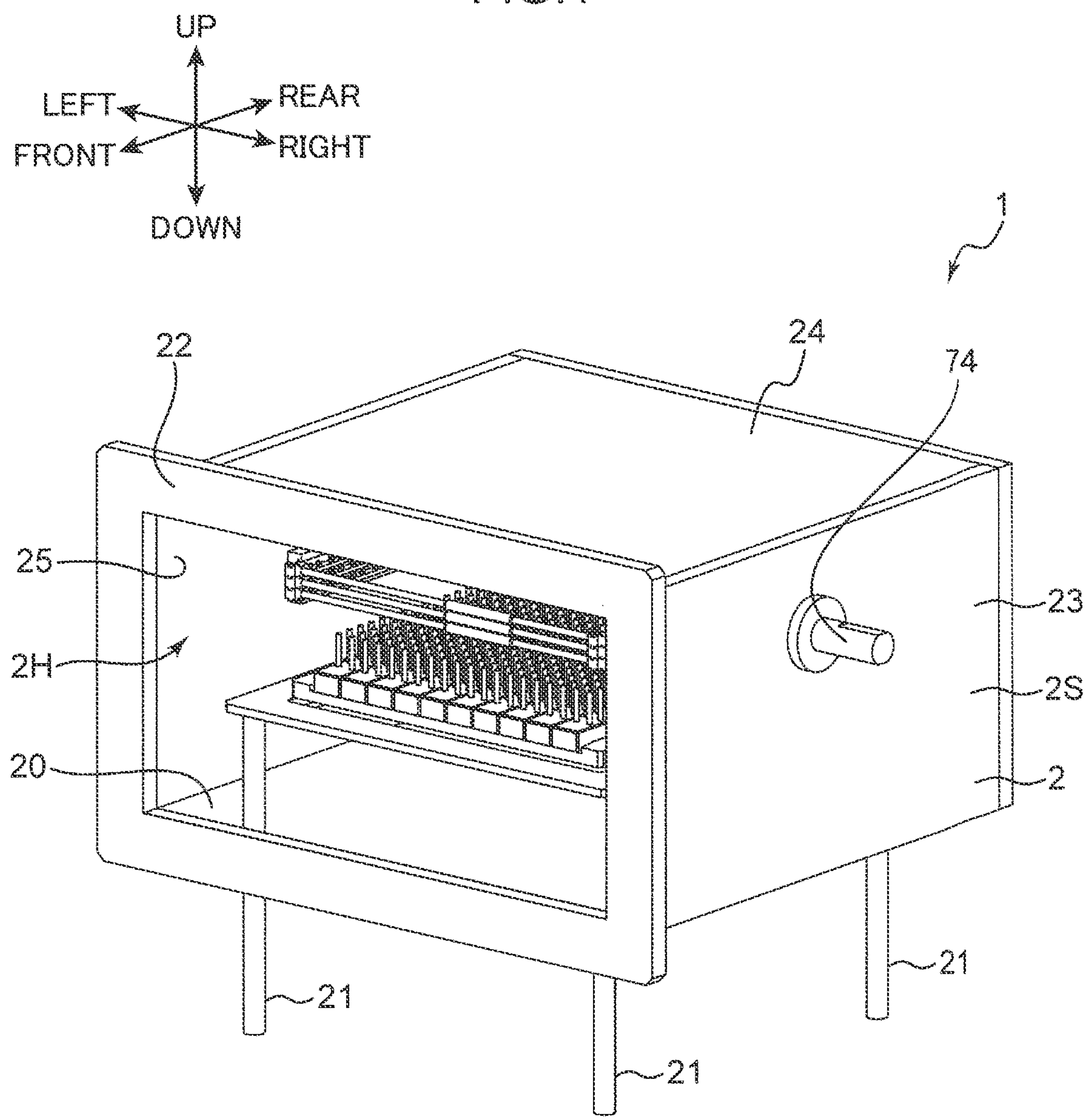
FIG. 1 is a perspective view of a hot filament CVD device according to an embodiment of the present invention.
Figure 2:
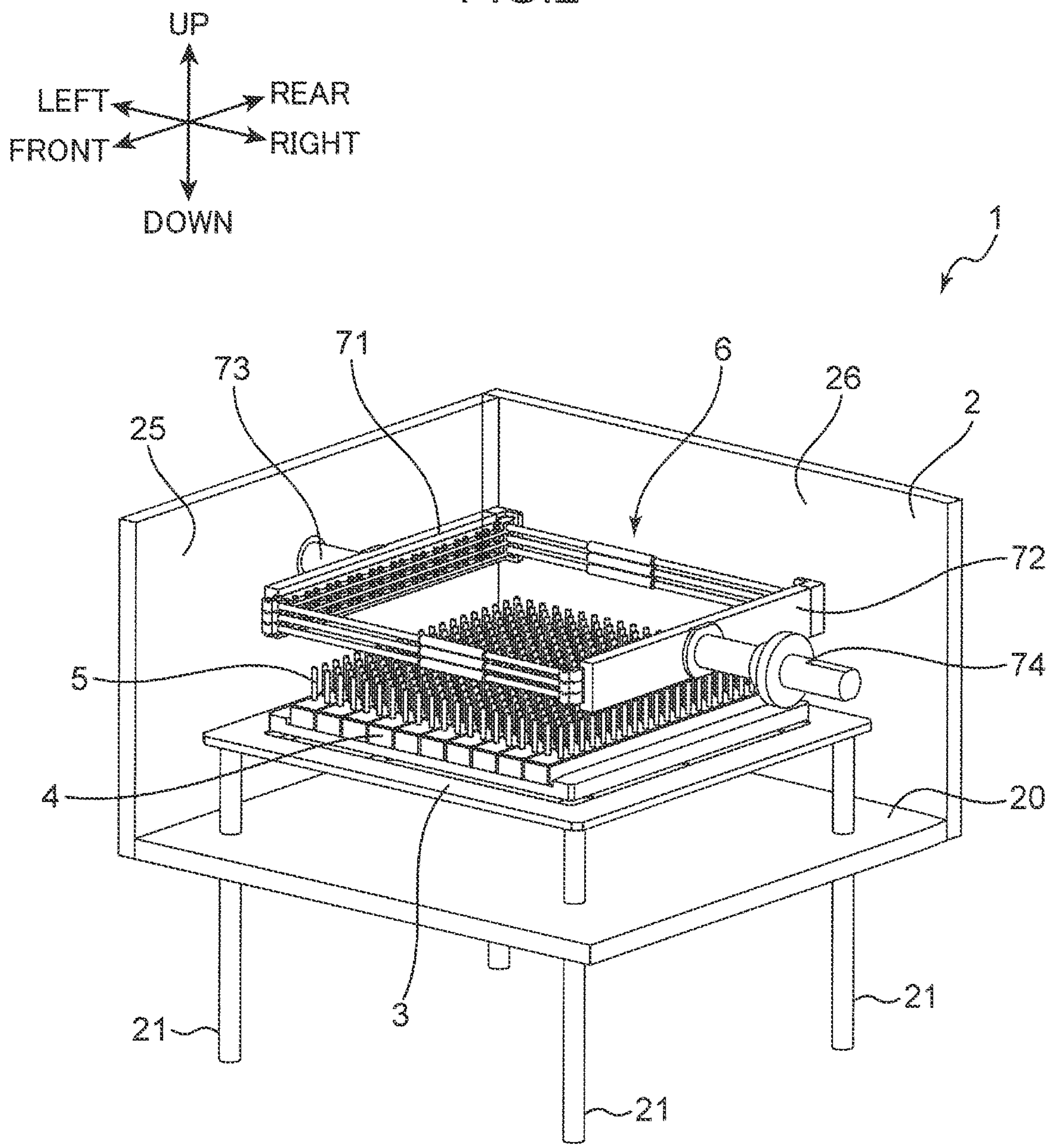
FIG. 2 is a perspective view illustrating an internal structure of the hot filament CVD device according to the embodiment of the present invention.
Figure 3:
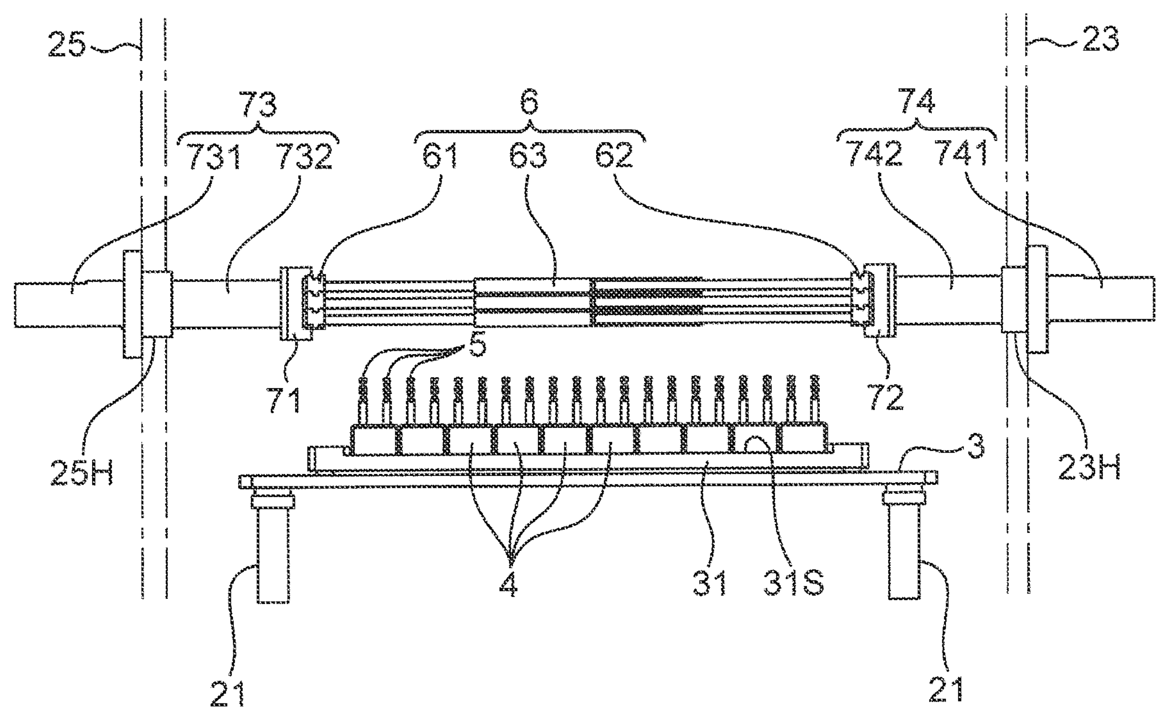
FIG. 3 is a front view illustrating the internal structure of the hot filament CVD device according to the embodiment of the present invention.
Figure 4:
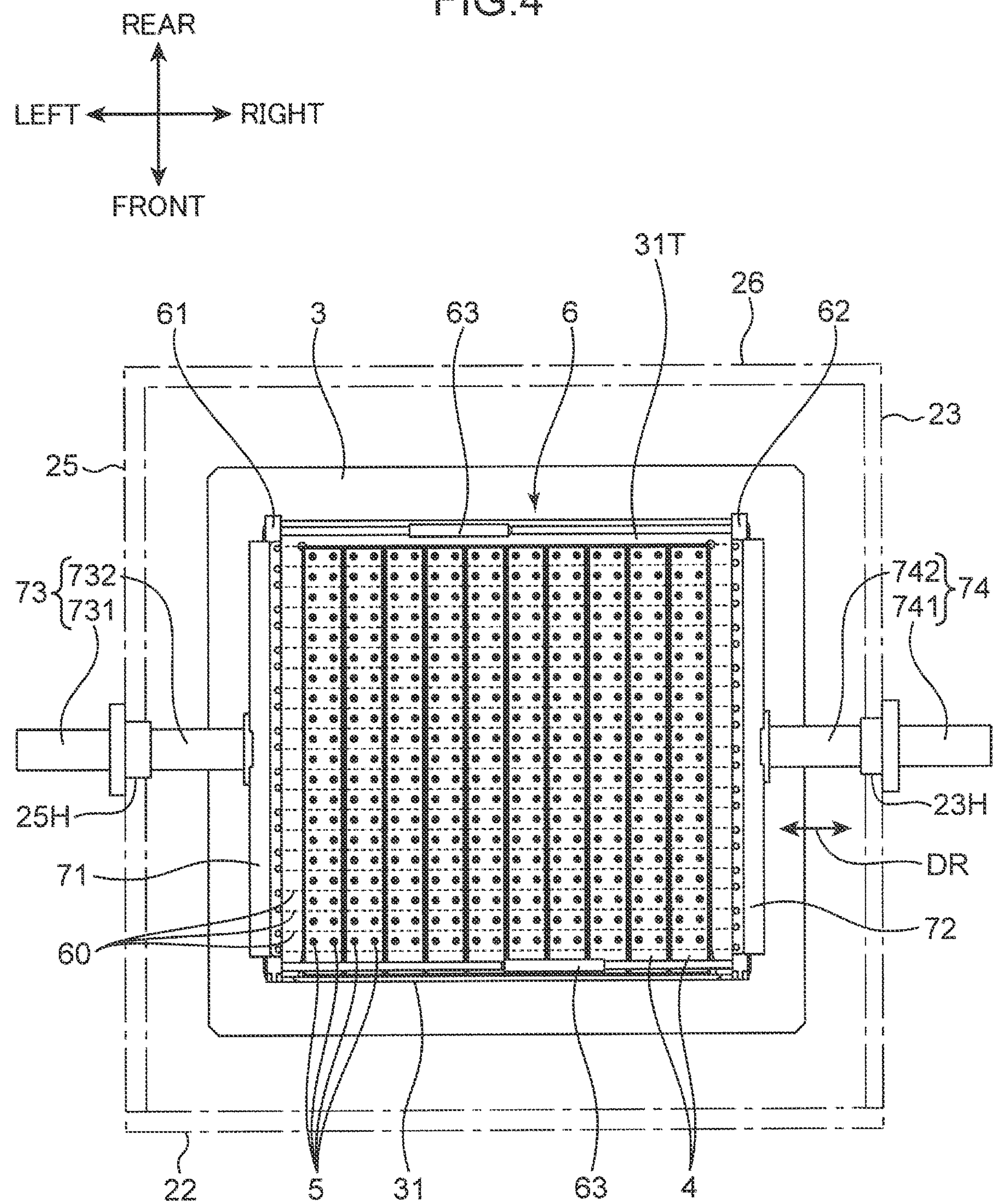
FIG. 4 is a plan view illustrating the internal structure of the hot filament CVD device according to the embodiment of the present invention.

Hereinafter, a hot filament CVD device 1 according to an embodiment of the present invention will be described with reference to the drawings. FIG. 1 is a perspective view of the hot filament CVD device 1 according to the present embodiment. FIGS. 2 to 4 are respectively a perspective view, a front view, and a plan view, illustrating the internal structure of the het filament CVD device 1. FIG. 2 illustrates a chamber 2 described later that is partially eliminated.

The hot filament CVD device 1 performs coating treatment on multiple workpieces 5 (base materials). The workpieces 5, for example, are each a drill blade in the present embodiment. As a material of each of the workpieces 5, cemented carbide is typically used. A hot filament CVD method is for forming a thin film using a product of thermal decomposition or a chemical reaction. The hot filament CVD method is a type of chemical vapor deposition (CVD) and uses a decomposition product or a chemical reaction of a material gas due to thermal energy emitted by a filament. The hot filament CVD device 1 can be suitably used for forming a carbon-based thin film, particularly a diamond thin film (polycrystalline diamond thin film). In the present embodiment, the hot filament CVD device 1 forms a diamond thin film on a surface of each of the workpieces 5 by the hot filament CVD method. As a material gas for forming such a diamond thin film, a mixed gas is used in which a carbon compound gas such as a hydrocarbon and a hydrogen gas are mixed. In the present embodiment, a mixed gas composed of 1% methane and 99% hydrogen by volume is used.

The hot filament CVD device 1 includes the chamber 2 having an internal space. The chamber 2 has a chamber body 2S and a door (not illustrated). The chamber body 2S defines the above internal space. The chamber body 2S includes a bottom 20, four (multiple) legs 21, a front flange 22, a right wall 23, a top plate 24, a left wall 25, and a rear wall 26 (FIGS. 1 and 2). The front flange 22 is provided with an opening 2H. The door (not illustrated) is attached to the chamber body 2S in an openable and closable manner. The door, when closed, seals the opening 2H. The door, when opened, opens the opening 2H. The four legs 21 each have a lower end extended downward from the bottom 20. Each of the legs 21 has an air cylinder structure and can be extended and contracted. Each of the legs 21 has an upper end that is disposed inside the chamber 2 and connected to a stage 3 described later. The internal space of the chamber 2 communicates with a vacuum pump (not illustrated) to cause the internal space of the chamber 2 to be in a vacuum or a substantially vacuum state during the coating treatment.

The hot filament CVD device 1 further includes the stage 3, multiple workpiece support blocks 4 (base material supports) for supporting the respective multiple workpieces 5, a filament electrode unit 6 (filament unit), and a fixed electrode 71 (first electrode), a movable electrode 72 (second electrode), a left support 73, and a right support 74.

The stage 3 is disposed horizontally inside the chamber 2 and supports the multiple workpiece support blocks 4. The stage 3 has a rectangular shape in plan view, and the legs 21 described above are connected to four corners of a lower surface of the stage 3. When each of the legs 21 is extended and contracted by a stage drive unit 83 described later, the stage 3 moves up and down inside the chamber 2. The stage 3 includes a table 31 in a rectangular shape in top view. The table 31 is formed with a fixing portion 31S in a recessed shape to allow the multiple workpiece support blocks 4 to be disposed without gaps in the left-right direction.

Each of the multiple workpiece support blocks 4 has a rectangular parallelepiped shape (strip shape) elongated in a front-rear direction. Each of the workpiece support blocks 4 is provided with multiple support holes 4H (refer to FIG. 9) (holes) opened in its upper surface, into each of which a workpiece 5 can be inserted in a vertical direction. Specifically, each of the workpiece support blocks 4 is provided with two rows of groups of the multiple support holes 4H at an interval in the left-right direction, and each of the groups of multiple support holes 4H includes the multiple support holes 4H disposed at intervals in the front-rear direction. At this time, the intervals in the front-rear direction of the multiple support holes 4H are set evenly.

As illustrated in FIGS. 2 and 3, the filament electrode unit 6 is disposed above the stage 3 (multiple workpieces 5) inside the chamber 2. The filament electrode unit 6 includes multiple filaments 60 (FIG. 4). Structure of the filament electrode unit 6 will be described in more detail later.

The fixed electrode 71 and the movable electrode 72 are disposed inside the chamber 2. As illustrated in FIGS. 2 and 4, the fixed electrode 71 and the movable electrode 72 are disposed extending in the front-rear direction. The fixed electrode 71 is electrically connected to a left end (one end in a first direction) of each of the multiple filaments 60. In contrast, the movable electrode 72 is electrically connected to a right end (the other end in the first direction) of each of the multiple filaments 60. The fixed electrode 71 and the movable electrode 72 are electrically connected to a heating power source 81 described later. Upon receiving electric power of the heating power source 81, the fixed electrode 71 and the movable electrode 72 allow a predetermined current to flow between the left end and the right end of each of the multiple filaments 60. As a result, the multiple filaments 60 are heated.

The left support 73 and the right support 74 support the fixed electrode 71 and the movable electrode 72, respectively. The left support 73 and the right support 74 electrically connect the heating power source 81 and the filament electrode unit 6. Thus, electrical wiring (not illustrated) is provided inside the left support 73 and the right support 74. The left support 73 includes a left outer support 731 exposed to the outside of the chamber 2 and a left inner support 732 located inside the chamber 2 (FIG. 3). Similarly, the right support 74 includes a right outer support 741 exposed to the outside of the chamber 2 and a right inner support 742 located inside the chamber 2. In the present embodiment, the right inner support 742 of the right support 74 includes an extendable cylinder structure. The right inner support 742 extends and contracts inside the chamber 2 in response to a driving force generated by an electrode drive unit 82 (FIG. 5) described later. As a result, the movable electrode 72 can be moved in the left-right direction inside the chamber 2 (refer to arrow DR in FIG. 4).

As illustrated in FIGS. 3 and 4, through holes 23H and 25H through which the left support 73 and the right support 74 pass are opened in the right side wall 23 and the left side wall 25 of the chamber 2, respectively. Gaps between the through holes and the corresponding supports are sealed with a sealing material (not illustrated).

Figure 5:
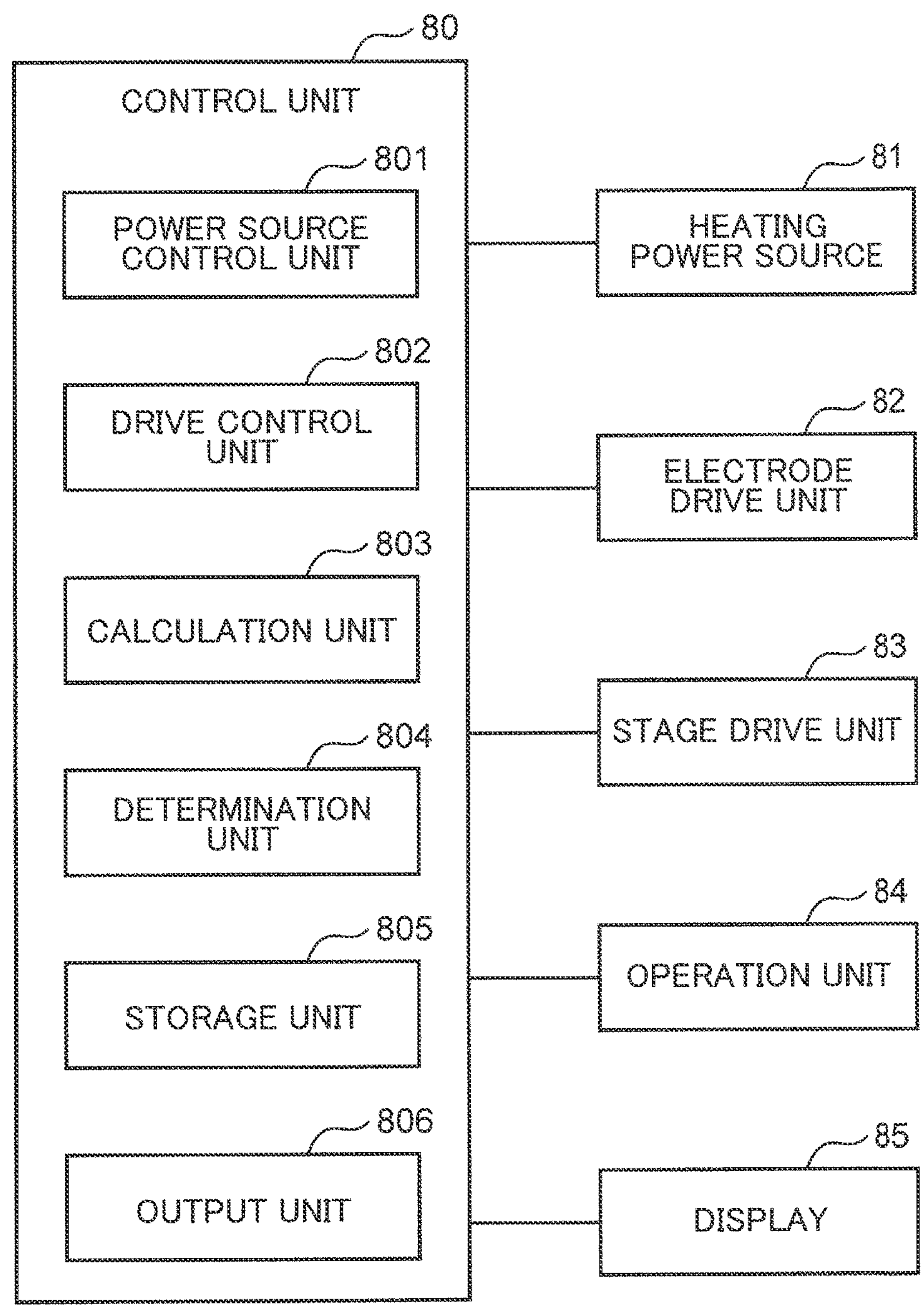
FIG. 5 is an electrical block diagram of the hot filament CVD device according to the embodiment of the present invention.

FIG. 5 is an electrical block diagram of the hot filament CVD device 1 according to the present embodiment. The hot filament CVD device 1 further includes a control unit 80. The control unit 80 comprehensively controls operation of the hot filament CVD device 1, and is electrically connected to transmission-reception destinations of a control signal, such as the heating power source 81 (power source), the electrode drive unit 82 (holding part moving mechanism), the stage drive unit 83 (stage moving mechanism), an operation unit 84, and a display 85. The control unit 80 is also electrically connected to other units provided in the hot filament CVD device 1. The hot filament CVD device 1 also includes a control unit of a gas flow rate (not illustrated), and the like.

The heating power source 81 allows a predetermined current to flow through the fixed electrode 71 and the movable electrode 72 so that the multiple filaments 60 are heated to about 2000° C. to 2500° C. For the heating power source 81, a high-frequency pulse power source having stable DC characteristics is desirably used.

The electrode drive unit 82 includes a motor and a gear mechanism (not illustrated). The electrode drive unit 82 generates a driving force for moving the movable electrode 72 inside the chamber 2. The electrode drive unit 82 is connected to the right support 74.

The stage drive unit 83 includes a motor and a gear mechanism (not illustrated). The stage drive unit 83 generates a driving force for moving the stage 3 up and down inside the chamber 2. The stage drive unit 83 is connected to the four legs 21.

The operation unit 84 is formed of an operation panel (not illustrated) and accepts various operations for controlling the hot filament CVD device 1.

The display 85 is formed of a liquid crystal panel (not illustrated) and displays information on various movements of the hot filament CVD device 1, for example.

The control unit 80 is configured by a central processing unit (CPU), a read only memory (RUM) for storing a control program, a random access memory (RAM) used as a work area of the CPU, and the like, and operates to functionally include a power source control unit 801, a drive control unit 802, a calculation unit 803, a determination unit 804, a storage unit 805, and an output unit 806, when the CPU executes the control program.

The power source control unit 801 controls the heating power source 81 according to operation information input to the operation unit 84. The power source control unit 801 controls output (kW), heating time, and the like of the heating power source 81.

The drive control unit 802 causes the electrode drive unit 82 according to the operation information input to the operation unit 84 to move the movable electrode 72 to left and right. The drive control unit 802 causes the stage drive unit 83 according to the operation information input to the operation unit 84 to move the stage 3 up and down.

The calculation unit 803 calculates the amount of thermal expansion of the filaments 60 in accordance with heating time of the filaments 60. The calculation unit 803 also calculates the amount of movement setting of the movable electrode 72 based on the amount of thermal expansion.

The determination unit 804 determines disconnection of the filaments 60 based on change in a current value of the heating power source 81. When the determination unit 804 determines that the filament 60 is disconnected, information on the disconnection is displayed on the display 85.

The storage unit 805 stores various parameters, threshold information, and the like for controlling the hot filament CVD device 1. As an example, the storage unit 805 stores parameters for the calculation unit 803 to calculate the amount of thermal expansion of each of the filaments 60.

The output unit 806 outputs various command signals according to the control of the heating power source 81 and the electrode drive unit 82, being performed by the power source control unit 801 and the drive control unit 802.

Structure of Filament Electrode Unit

Figure 6:
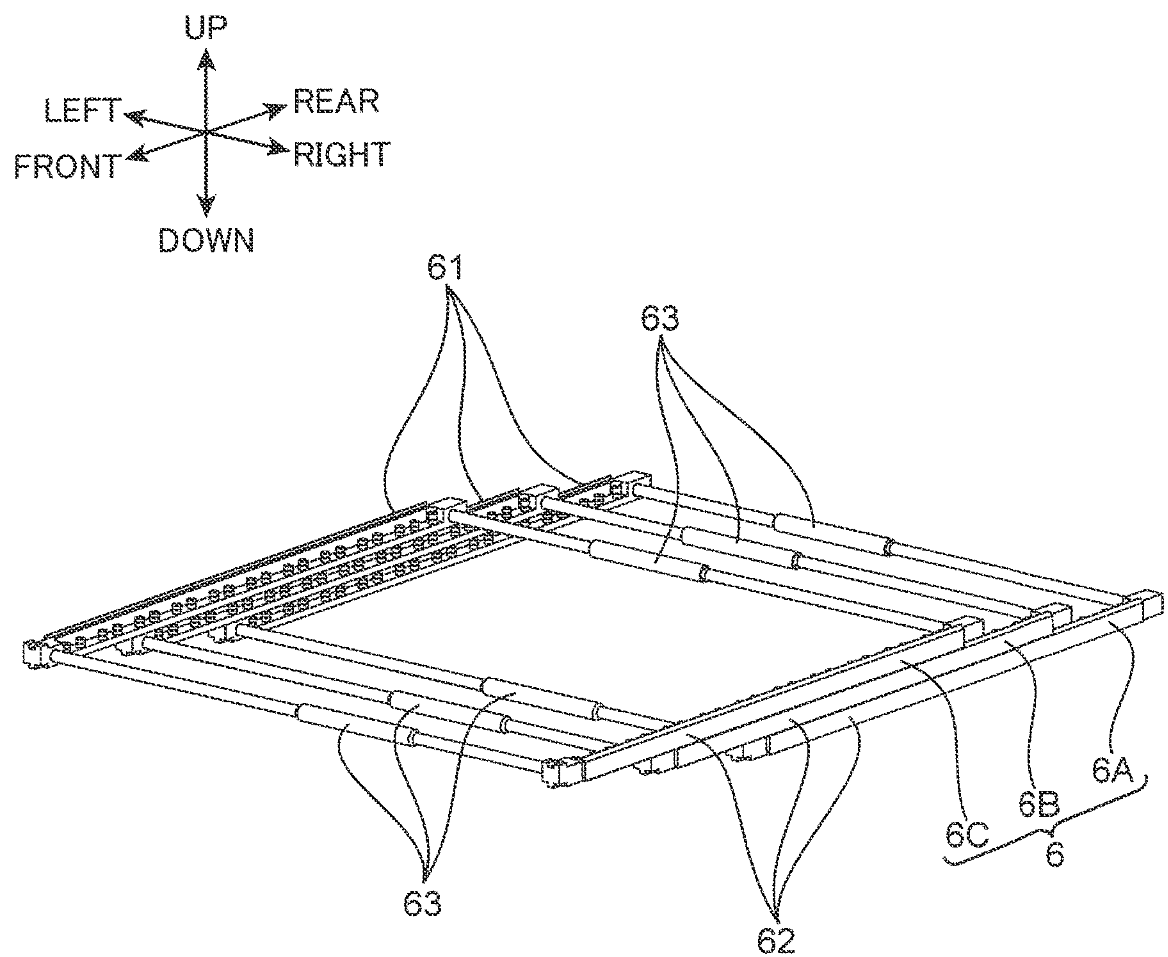
FIG. 6 is a perspective view of multiple filament cartridges of the hot filament CVD device according to the embodiment of the present invention.
Figure 7:
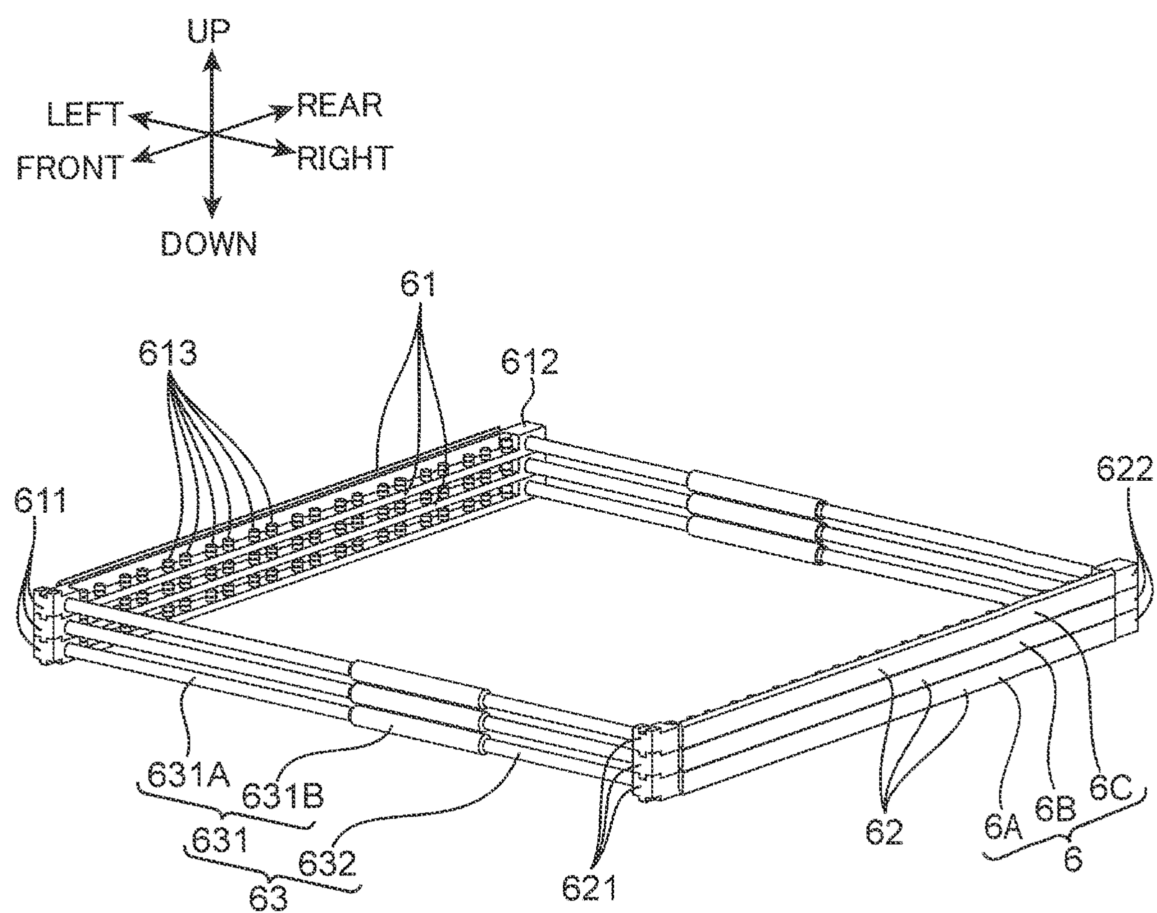
FIG. 7 is a perspective view of multiple filament cartridges of the hot filament CVD device according to the embodiment of the present invention.
Figure 8:
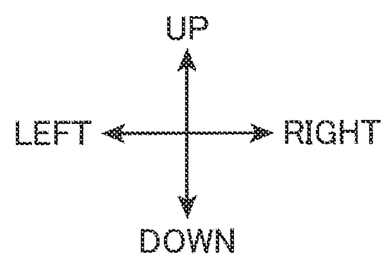
FIG. 8 is a sectional view of a connecting member of the filament cartridge according to the embodiment of the present invention.
Figure 8:
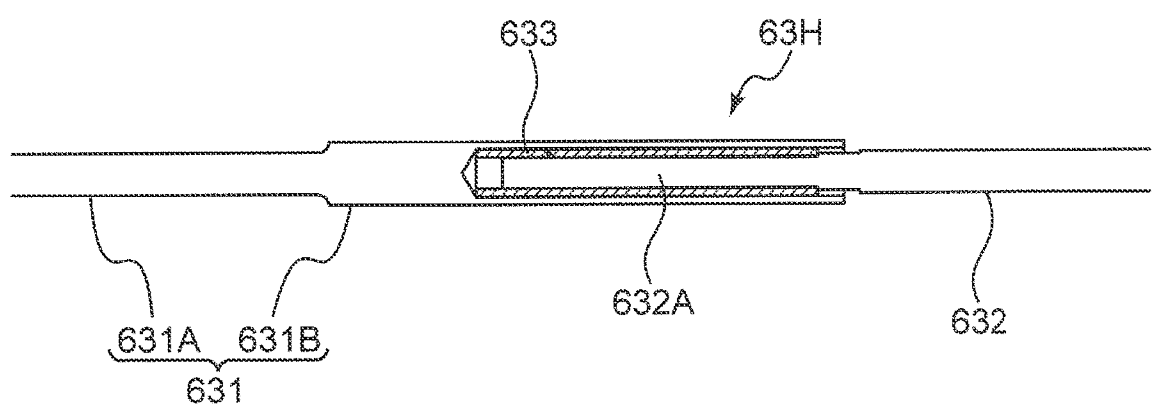

Next, structure of multiple filament cartridges according to the present embodiment will be described in more detail. FIGS. 6 and 7 are each a perspective view of the filament electrode unit 6 including the multiple cartridges according to the present embodiment. FIG. 8 is a sectional view of a connecting member 63 of the filament electrode unit 6.

In the present embodiment, the filament electrode unit 6 includes a first cartridge 6A, a second cartridge 6B, and a third cartridge 6C (multiple filament cartridges). The first cartridge 6A, the second cartridge 6B, and the third cartridge 6C each have the same structure. Each of the cartridges can be mounted inside the chamber 2 through the opening 2H (FIG. 1) with the door open. Hereinafter, the structure of the first cartridge 6A will be described as an example. The first cartridge 6A includes the multiple filaments 60, the left frame 61 (first frame), the right frame 62 (second frame), and paired connecting members 63. Each of the cartridges can be mounted in the chamber 2 even when it is flipped horizontally.

The multiple filaments 60 (FIG. 4) extend in the left-right direction (first direction) and axe disposed apart from each other in the front-rear direction (second direction intersecting the first direction). For each of the filaments 60, a wire made of a refractory metal such as tungsten or tantalum, having a wire diameter of 0.05 mm to 1.0 mm, is used. Each of the filament cartridges is provided with 20 filaments 60.

The left frame 61 is a member extending in the front-rear direction and supports left ends of the multiple filaments 60. The left frame 61 includes a left frame front end portion 611, a left frame rear end portion 612, and multiple filament engaging portions 613. The left frame front end portion 611 is disposed at a front end of the left frame 61 and supports a left end portion of the connecting member 63 on a front side. The left frame rear end portion 612 is disposed at a rear end of the left frame 61 and supports a left end portion of the connecting member 63 on a rear side. The multiple filament engaging portions 613 each engage a left end portion of the corresponding one of the filaments 60 (refer to FIG. 13). When the left frame 61 is supported by the fixed electrode 71, the left end portion of each of the filaments 60 and the heating power source 81 are electrically connected to each other through the corresponding one of the filament engaging portions 613.

Similarly, the right frame 62 is a member extending in the front-rear direction and supports right ends of the multiple filaments 60. The right frame 62 includes a right frame front end portion 621, a right frame rear end portion 622, and multiple filament engaging portions (not illustrated, similar to the filament locking portions 613 described above). The right frame front end portion 621 is disposed at a front end of the right frame 62 and supports a right end portion of the connecting member 63 on the front side. The right frame rear end portion 622 is disposed at a rear end of the right frame 62 and supports a right end portion of the connecting member 63 on the rear side. The multiple filament engaging portions each lock a right end portion of the corresponding one of the filaments 60. When the right frame 62 is supported by the movable electrode 72, the right end portion of each of the filaments 60 and the heating power source 81 are electrically connected to each other through the corresponding one of the filament engaging portions.

The paired connecting members 63 connects respective opposite ends of the left frame 61 in the front-rear direction and corresponding opposite ends of the right frame 62 therein in the left-right direction. With reference to FIGS. 7 and 8, each of the connecting members 63 includes a first support rod 631 and a second support rod 632 that are made of metal, and an insulating bush 633. The first support rod 631 includes a small diameter portion 631A and a large diameter portion 631B. The second support rod 632 includes a leading end portion 632A. As illustrated in FIG. 8, the large diameter portion 631B of the first support rod 631 is formed with a cavity in a cylindrical shape. The insulating bush 633 has a cylindrical shape and is preliminarily fitted into the cavity of the large diameter portion 631B. As illustrated in FIG. 8, the leading end portion 632A of the second support rod 632 is inserted into the insulating bush 633 in the first support rod 631. The insulating hush 633 is made of an insulating material such as ceramic, and prevents electric discharge between the first support rod 631 and the second support rod 632. The insulating bush 633 has high slidability to the leading end portion 632A made of metal, and thus can reduce a drive load applied to the electrode drive unit 82 due to telescopic movement of each of the connecting members 63. As described above, when the movable electrode 72 is moved left and right using a driving force generated by the electrode drive unit 82, the right frame 62 and the pair of front and rear second support rods 632, being connected to the movable electrode 72, move following the movable electrode 72. At this time, the leading end portion 632A of each of the second support rods 632 slides inside the insulating bush 633. As described above, in the present embodiment, the first cartridge 6A, the second cartridge 6B, and the third cartridge 6C each hold the multiple filaments 60 in parallel, and each of the connecting members 63 can be extended and contracted in a direction in which the filaments 60 extend. The large diameter portion 631B of the first support rod 631 and the leading end portion 632A of the second support rod 632 constitute a telescopic portion 63H (FIG. 8) of the present invention. When receiving a driving force of the electrode drive unit 82 from the right support 74, the telescopic portion 63H extends and contracts allowing a change in distance between the left frame 61 and the right frame 62.

Holding Part

Figure 9:
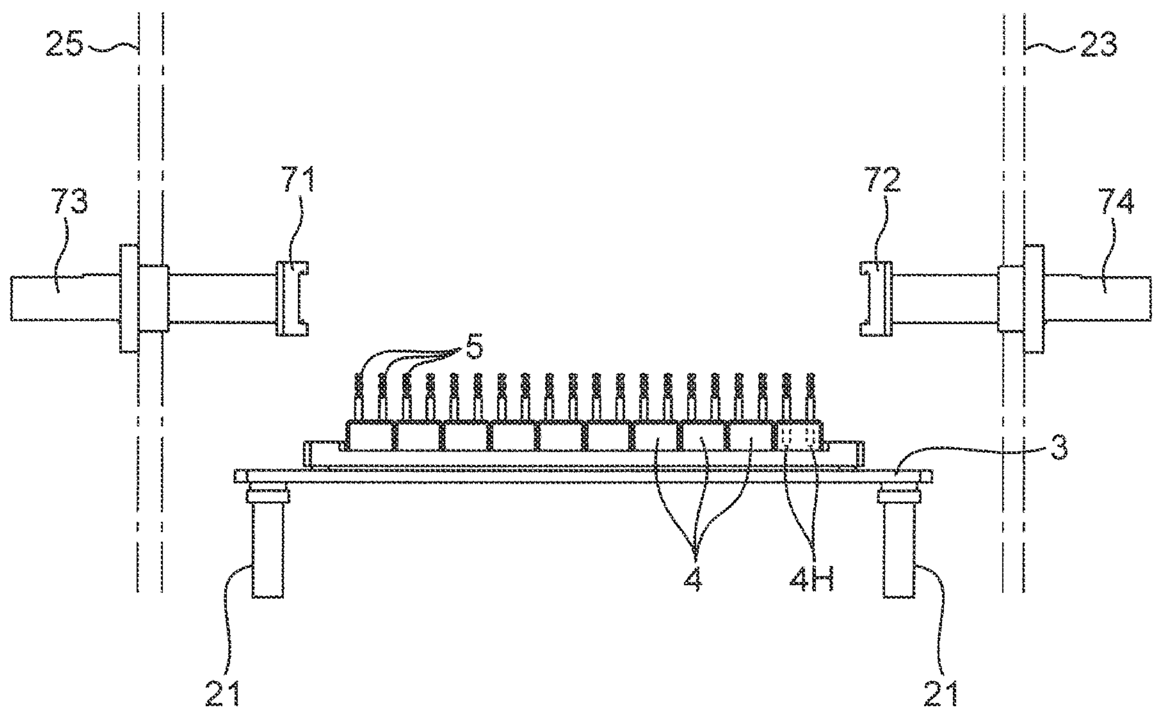
FIG. 9 is a front view illustrating the internal structure of the hot filament CVD device according to the embodiment of the present invention, and is a front view of a state in which the filament cartridge is detached.
Figure 10:
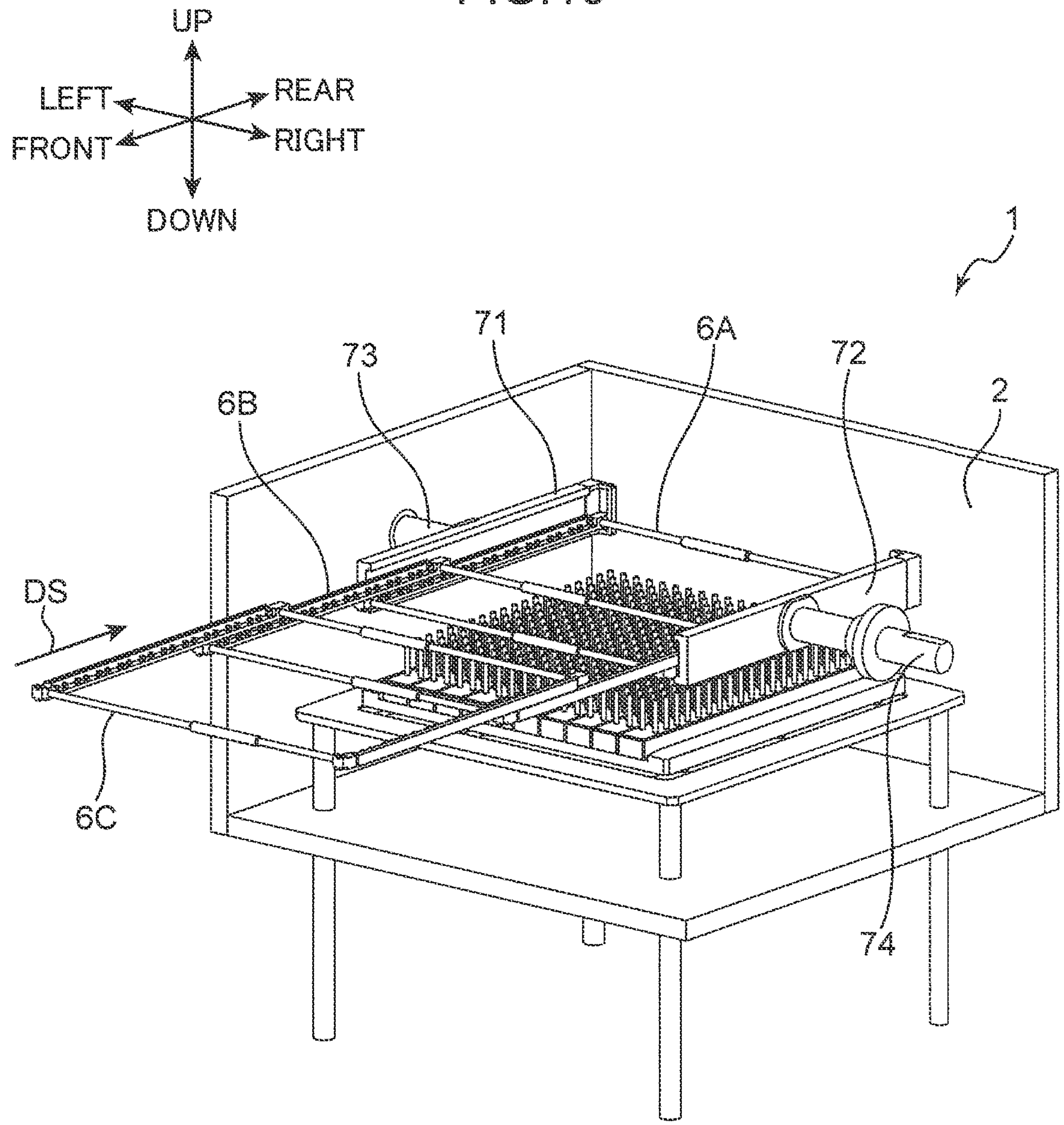
FIG. 10 is a perspective view illustrating the internal structure of the hot filament CVD device according to the embodiment of the present invention, and is a perspective view illustrating a state in which the filament cartridge is attached.
Figure 11:
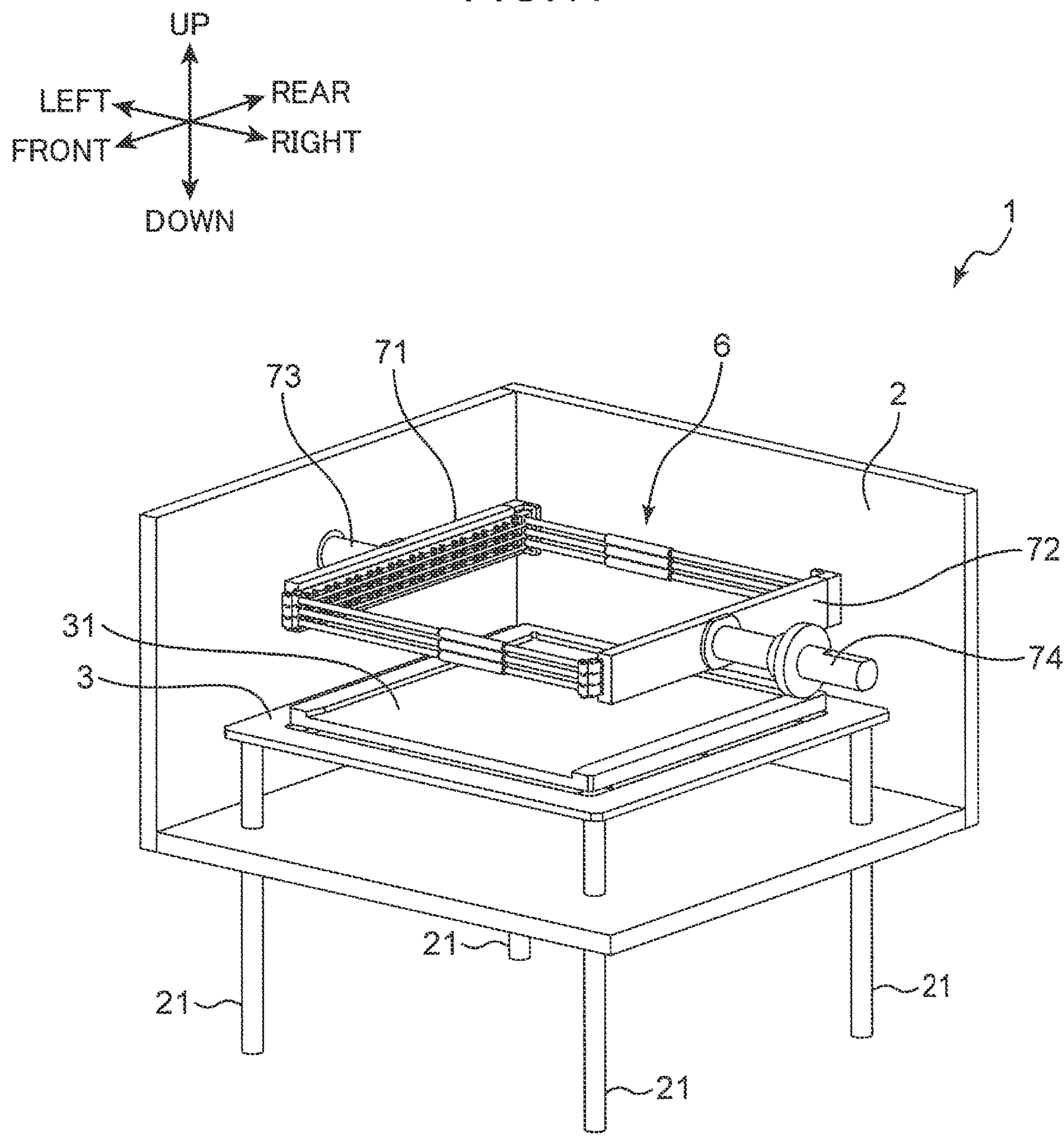
FIG. 11 is a perspective view illustrating the internal structure of the hot filament CVD device according to the embodiment of the present invention, and is a perspective view of a state in which the filament cartridge is attached.
Figure 12:
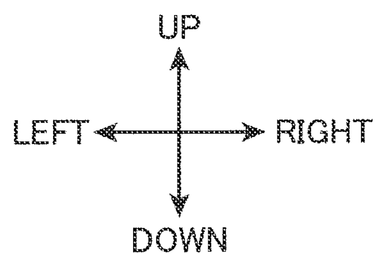
FIG. 12 is a sectional view of a holding part of the hot filament CVD device according to the embodiment of the present invention.
Figure 12:
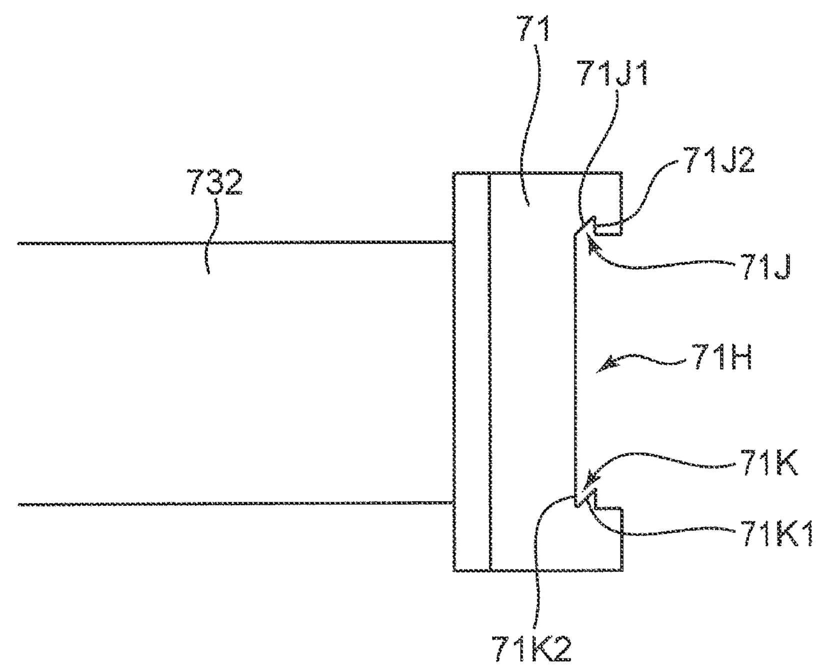

FIG. 9 is a front view illustrating an internal structure of the hot filament CVD device 1 according to the present embodiment, and is a front view of a state in which the filament electrode unit 6 is detached. FIG. 10 is a perspective view illustrating a state in which each cartridge of the filament electrode unit 6 is mounted on the fixed electrode 71 and the movable electrode 72. FIG. 11 is a perspective view illustrating a state in which each cartridge of the filament electrode unit 6 is held by the fixed electrode 71 and the movable electrode 72. FIG. 12 is a sectional view of the fixed electrode 71 of the hot filament CVD device 1, and FIG. 13 is a sectional view of a state in which each cartridge of the filament electrode unit 6 is held by the fixed electrode 71.

In the present embodiment, the fixed electrode 71 and the movable electrode 72 each include a holding part for holding the filament electrode unit 6. The fixed electrode 71 and the movable electrode 72 are bilaterally symmetrical in shape, so that the fixed electrode 71 will be described below as an example. As illustrated in FIG. 12, the fixed electrode 71 has a U-shape turned sideways, opening to the right, in section. In other words, the fixed electrode 71 includes an engaging recess 71H (holding part). The engaging recess 71H is formed throughout the fixed electrode 71 in the front-rear direction. The engaging recess 71H has an upper end portion formed with an electrode upper engaging portion 71J. The engaging recess 71H has a lower end portion formed with an electrode lower engaging portion 71K. The electrode upper engaging portion 71J has a triangular shape in section and is defined by an upper inclined portion 71J1 and an upper inner portion 71J2. Similarly, the electrode lower engaging portion 71K has a triangular shape in section and is defined by a lower inclined portion 71K1 and a lower inner portion 71K2. As illustrated in FIG. 12, the upper inclined portion 71J1 and the lower inclined portion 71K1 are parallel to each other and are inclined downward (to the left) toward the inside of the engaging recess 71H.

Figure 13:
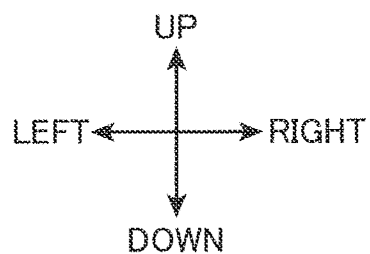
FIG. 13 is a sectional view of a state in which the filament cartridge is supported by the holding part of the hot filament CVD device according to the embodiment of the present invention.
Figure 13:
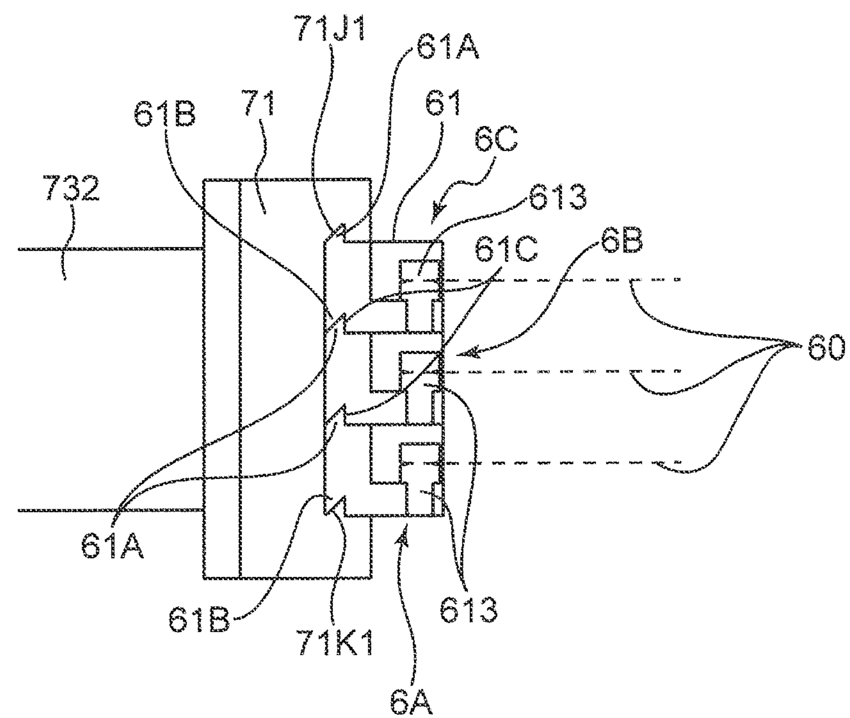

Then, with reference to FIG. 13, the left frame 61 of each of the first cartridge 6A, the second cartridge 6B, and the third cartridge 6C has a shape that can be fitted into the engaging recess 71H of the fixed electrode 71. That is, the left frame 61 has an upper left end portion formed with an upper protrusion 61A and a lower left end portion formed with a lower protrusion 61B. A lower recess 61C is formed on the right of the lower protrusion 61B. The upper protrusion 61A and the lower protrusion 61B have inclined surfaces that are respectively in contact with the upper inclined portion 71J1 and the lower inclined portion 71K1 (FIG. 13).

A case will be described in which the first cartridge 6A, the second cartridge 6B, and the third cartridge 6C are combined overlapping each other in advance as illustrated in FIG. 7, and the filament electrode unit 6 is integrally attached to the fixed electrode 71 and the movable electrode 72. As illustrated in FIG. 13, when the upper protrusion 61A of the first cartridge 6A is fitted into the lower recess 61C of the second cartridge 6B, and the upper protrusion 61A of the second cartridge 6B is fitted into the lower recess 61C of the third cartridge 6C, the three cartridges are connected to each other. The same applies to the movable electrode 72 and the right frame 62. Then, the first cartridge 6A is inserted into the chamber 2 along the fixed electrode 71 while the lower protrusion 61B of the first cartridge 6A located at the lowermost position of the filament electrode unit 6 is fitted into the electrode lower engaging portion 71K (FIG. 12) of the fixed electrode 71. At this time, the right frame 62 of the first cartridge 6A is also inserted into the chamber along the movable electrode 72 using a similar structure. In contrast, the third cartridge 6C is inserted into the chamber 2 along the fixed electrode 71 while the upper protrusion 61A of the third cartridge 6C located at the uppermost position of the filament electrode unit 6 is fitted into the electrode upper engaging portion 71J (FIG. 12) of the fixed electrode 71. At this time, the right frame 62 of the third cartridge 6C is also inserted into the chamber along the movable electrode 72 using a similar structure. The first cartridge 6A, the second cartridge 6B, and the third cartridge 6C of the filament electrode unit 6 may be inserted into the chamber 2 in this order from below as illustrated in FIGS. 6 and 10.

As described above, in the present embodiment, the fixed electrode 71 and the movable electrode 72 each have a shape for guiding the first cartridge 6A, the second cartridge 6B, and the third cartridge 6C that are inserted into the internal space of the chamber 2 through the opening 2H in a mounting direction (arrow DS in FIG. 10) parallel to the front-rear direction. The fixed electrode 71 and the movable electrode 72 respectively hold the left frame 61 and the right frame 62 of each of the cartridges such that the multiple filaments 60 face the corresponding multiple workpieces 5 in the vertical direction (a third direction intersecting a plane including the first direction and the second direction) (FIGS. 3 and 4). Then, the multiple filaments 60 of each of the first cartridge 6A, the second cartridge 6B, and the third cartridge 6C mounted in the chamber 2 are disposed at intervals in the vertical direction. As a result, a space is formed between the filaments 60 adjacent to each other in the left-right direction, the space passing through the first cartridge 6A, the second cartridge 6B, and the third cartridge 6C in the vertical direction. At the time of the coating treatment, the workpieces 5 supported by the workpiece support blocks 4 are inserted into the space as described later.

Figure 14:
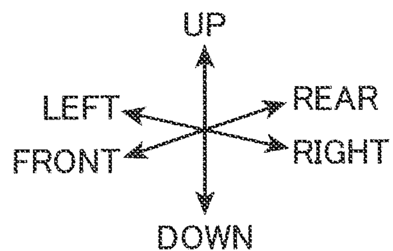
FIG. 14 is a perspective view illustrating the internal structure of the hot filament CVD device according to the embodiment of the present invention, and is a perspective view illustrating a state of mounting a base material support.
Figure 14:
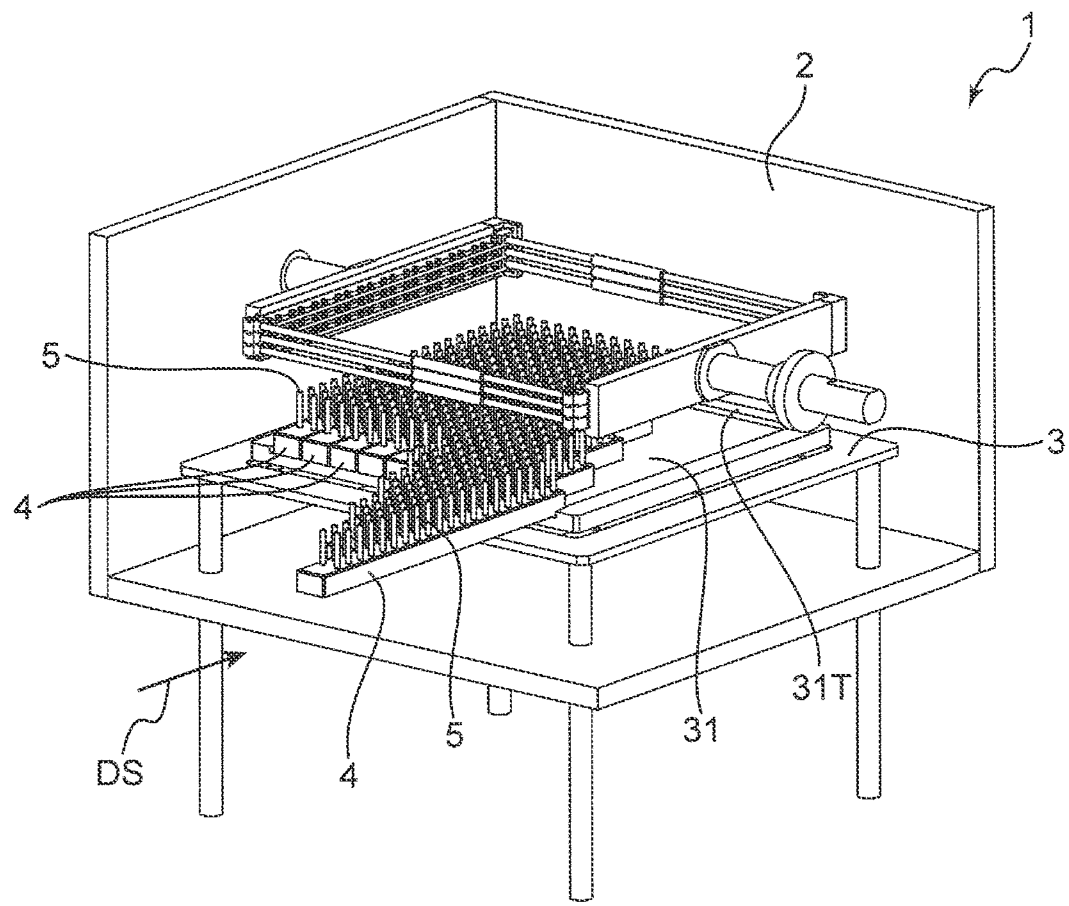
Figure 15:
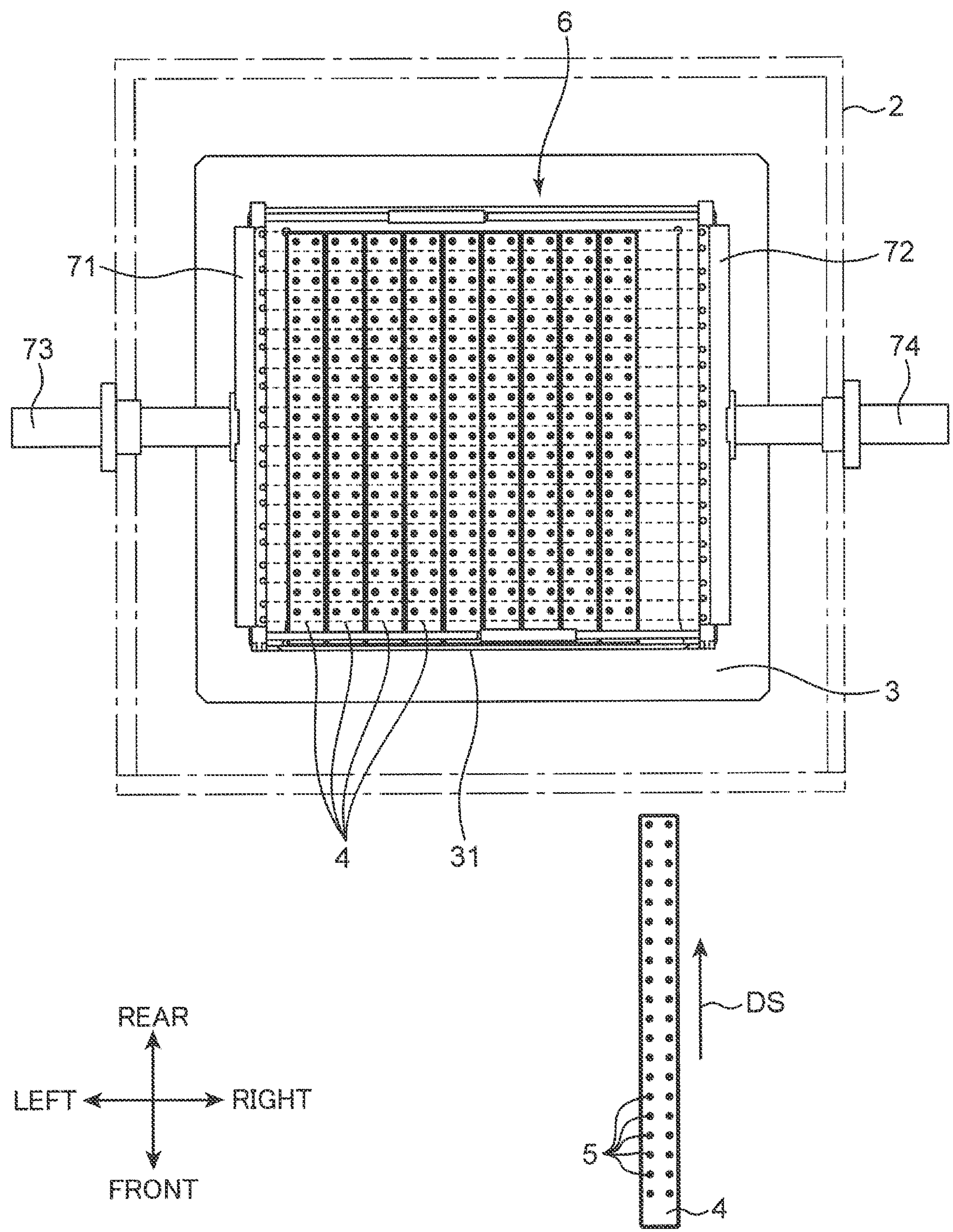
FIG. 15 is a plan view illustrating the internal structure of the hot filament CVD device according to the embodiment of the present invention, and is a plan view illustrating a state of mounting the base material support.

FIG. 14 is a perspective view illustrating an internal structure of the hot filament CVD device 1 according to the present embodiment, and is a perspective view illustrating a state of mounting the workpiece support blocks 4 on the stage 3. FIG. 15 is a plan view illustrating the internal structure of the hot filament CVD device 1, and is a plan view illustrating a state of mounting the workpiece support blocks 4 on the stage 3. As described above, the stage 3 includes the table 31. The table 31 is formed with the fixing portion 31S in a recessed shape (FIG. 3). The fixing portion 31S has a width in the left-right direction that corresponds to a length acquired by adding a slight gap fitting tolerance to the sum of widths of the multiple (10) workpiece support blocks 4 in the left-right direction. When each of the workpieces 5 is a drill blade, the drill blade has a heavy weight, and thus it is difficult to place many workpieces 5 on the table 31 at one time. In the present embodiment, as illustrated in FIGS. 14 and 15, the multiple workpiece support blocks 4 each have a rectangular parallelepiped shape extending in the front-rear direction, so that the multiple workpieces 5 (FIG. 15) distributed throughout the table 31 can be divided and placed on the table 31. The fixing portion 31S in a recessed shape has a function of positioning the multiple workpiece support blocks 4 in the left-right direction. The table 31 includes a restriction portion 31T (FIGS. 4 and 14) disposed at a rear end of the fixing portion 31S. The restriction portion 31T is a wall portion extending in the left-right direction, and regulates a rear end position of each of the workpiece support blocks 4 by being in contact with the multiple workpiece support blocks 4. As a result, positions of the multiple workpieces 5 supported on the corresponding multiple workpiece support blocks 4 in the front-rear and left-right directions are restricted. In other words, the multiple support holes 4H (FIG. 9) formed in each workpiece support block 4 are opened in the workpiece support block 4 such that the multiple workpieces 5 are disposed between the corresponding multiple filaments 60 of each cartridge of the filament electrode unit 6 held by the fixed electrode 71 and the movable electrode 72 when viewed from the vertical direction (third direction). Then, the fixing portion 31S of the table 31 restricts positions of the respective workpiece support blocks 4 such that the multiple workpieces 5 are disposed between the corresponding multiple filaments 60.

Figure 16:
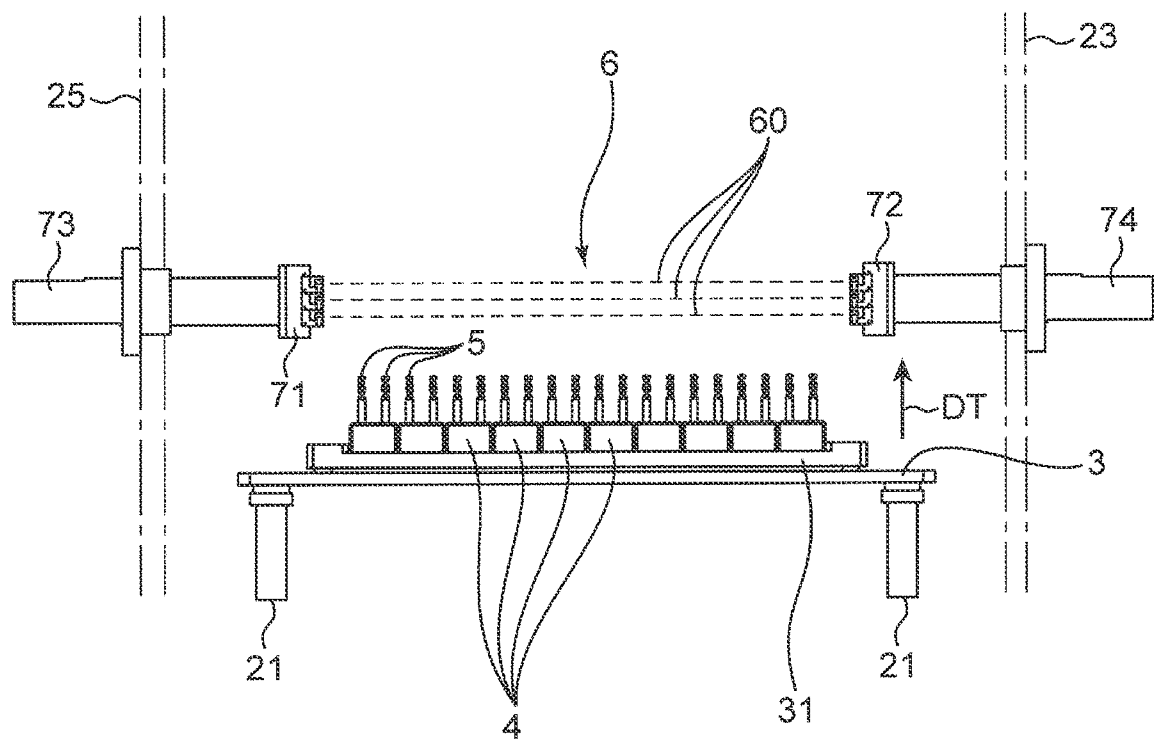
FIG. 16 is a front view illustrating the internal structure of the hot filament CVD device according to the embodiment of the present invention, and is a front view illustrating a state of raising a stage.
Figure 17:
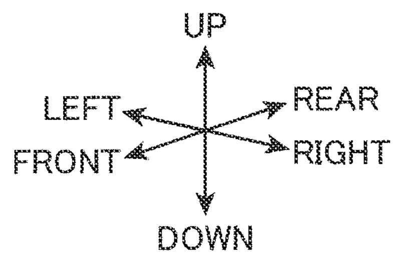
FIG. 17 is a perspective view illustrating the internal structure of the hot filament CVD device according to the embodiment of the present invention, and is a perspective view illustrating a state in which the stage is raised.
Figure 17:
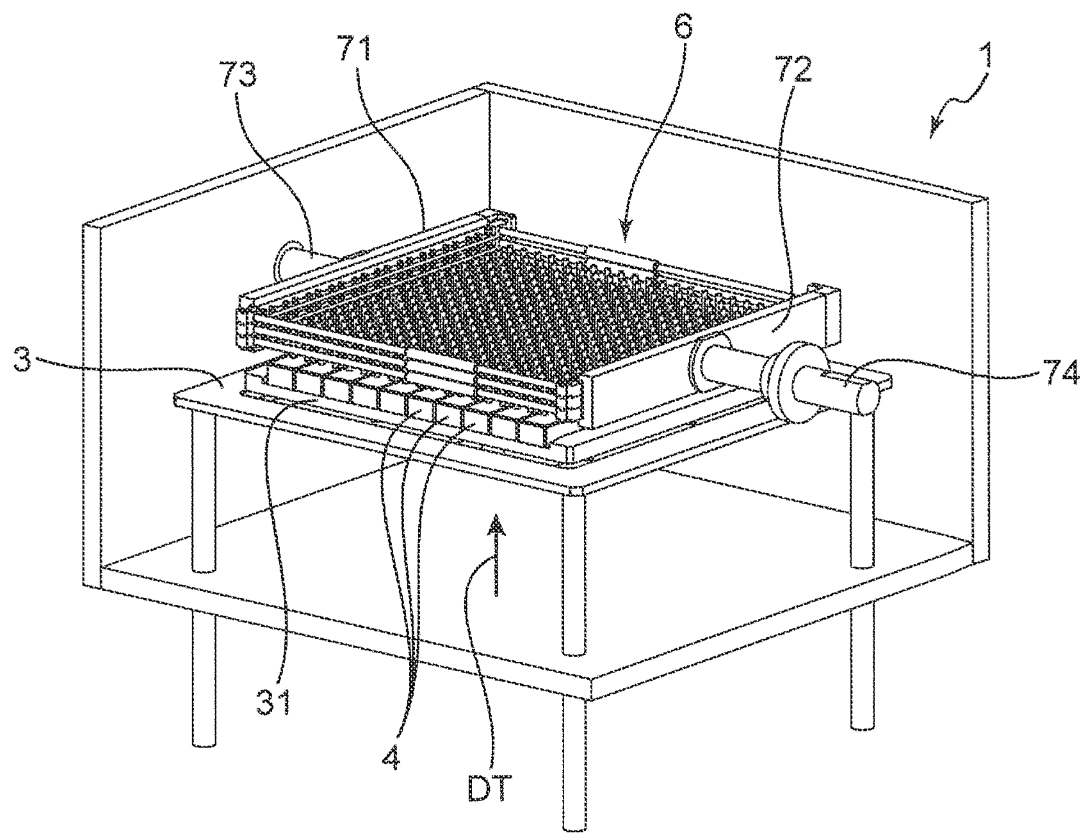
Figure 18:
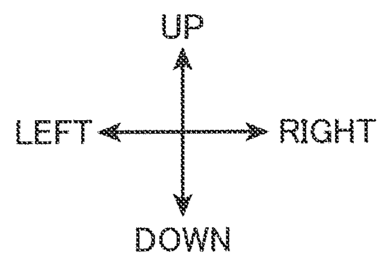
FIG. 18 is a front view illustrating the internal structure of the hot filament CVD device according to the embodiment of the present invention, and is a front view illustrating a state in which the stage is raised.
Figure 18:
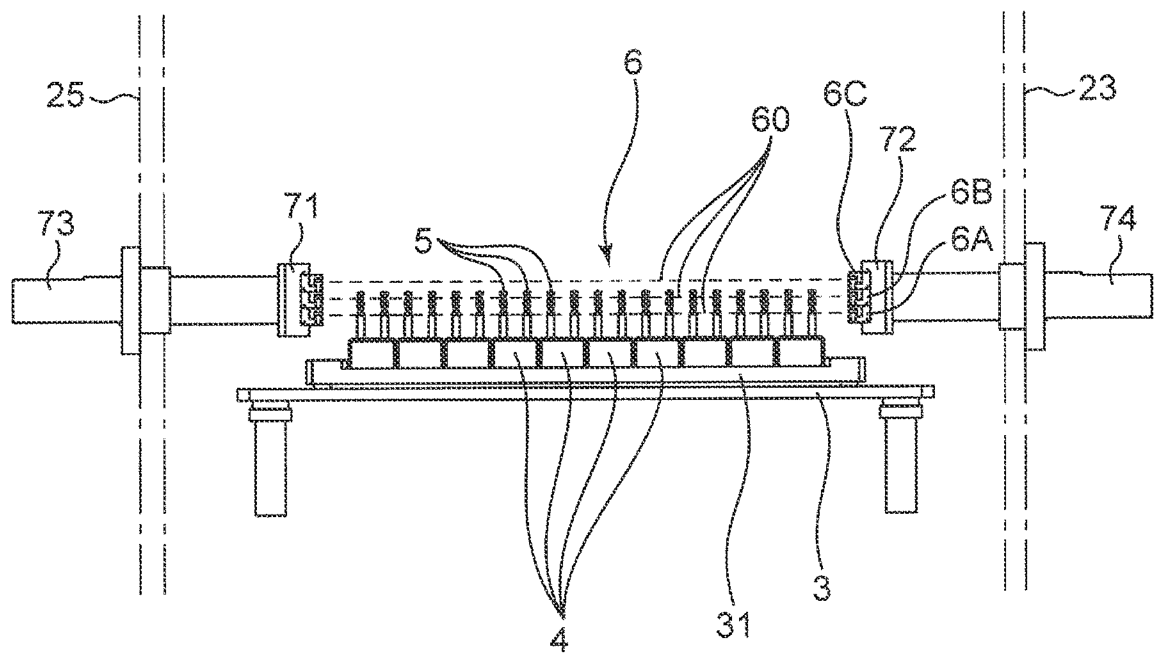

FIG. 16 is a front view illustrating the internal structure of the hot filament CVD device 1 according to the present embodiment, and is a front view illustrating a state of raising the table 31 (stage 3). FIG. 17 is a perspective view illustrating the internal structure of the hot filament CVD device 1, and is a perspective view illustrating a state in which the table 31 is raised. Further, FIG. 18 is a front view illustrating the internal structure of the hot filament CVD device 1, and is a front view illustrating a state in which the table 31 is raised.

As described above, the coating treatment to the multiple workpieces 5 is prepared such that the filament electrode unit 6 is mounted on the fixed electrode 71 and the movable electrode 72, and the multiple workpiece support blocks 4 supporting the corresponding multiple workpieces 5 are mounted on the table 31. When the door (not illustrated) is closed, the inside of the chamber 2 is evacuated by the vacuum pump and the mixed gas is introduced. When the operator operates the operation unit 84 (FIG. 5), the stage drive unit 83 moves the stage 3 upward (arrow DT in FIGS. 16 and 17). As a result, the multiple workpieces 5 are positioned between the corresponding multiple filaments 60 in a plane including the front-rear direction and the left-right direction. In the present embodiment, as illustrated in FIG. 18, upward movement of the stage 3 is controlled such that the tip of each of the workpieces 5 is located between the filament 60 of the third cartridge 6C and the filament 60 of the second cartridge 6B.

Next, when the power source control unit 801 causes the heating power source 81 to allow a current to flow into the fixed electrode 71 and the movable electrode 72 in response to operator's operation, heating of the multiple filaments 60 is started. Then, each of the filaments 60 thermally expands with the heating. In the present embodiment, the electrode drive unit 82 can move the movable electrode 72 in the left-right direction (extending direction of the filaments 60) as described above. The calculation unit 803 calculates the amount of thermal expansion ΔL (mm) of each of the filaments 60 from Equation 1.

$$\Delta L=\alpha\times(T2-T1)\times L \quad \text{(Equation 1)}$$

In Equation 1, α is a coefficient of thermal expansion for each material, T1 is room temperature (° C.), T2 is the temperature of the filaments 60 measured with a radiation thermometer, and L (mm) is an original length of each of the filaments 60.

Then, the drive control unit 802 causes the electrode drive unit 82 to move the movable electrode 72 to the right (in the direction of pulling the filaments 60) by the amount of thermal expansion calculated by the calculation unit 803. At this time, in the present embodiment, the movable electrode 72 is moved by the amount of thermal expansion of the filaments 60, so that no extra tension is applied to the filaments 60. As a result, a central portion of each of the filaments 60 is prevented from hanging downward (deforming) due to the thermal expansion of each of the filaments 60. Such movement control of the movable electrode 72 (attitude control of the filaments 60) is mainly performed in an initial stage of heating where the temperature of the filaments 60 rises. Such control may be continued throughout coating treatment time for the workpieces 5.

When each of the filaments 60 reaches a predetermined heating temperature in accordance with input power of the heating power source 81, the filaments 60 heat the material gas in the chamber 2, and then graphite and other non-diamond carbons react with atomic hydrogen and evaporate. Here, the atomic hydrogen reacts with an original hydrocarbon gas (methane) to form carbon-hydrogen species with high reactivity. When this species decomposes, hydrogen is released, pure carbon or diamond is formed, and a diamond film is formed on each of the workpieces 5.

As described above, in the present embodiment, the central portion of each of the filaments 60 is prevented from hanging downward during the coating treatment, so that a distance between each of the filaments 60 and the corresponding one of the workpieces 5 is prevented from varying in a longitudinal direction (left-right direction) of each of the filaments 60. This prevents fluctuation in deposition speed of each of the workpieces 5 and variation in deposition result (film thickness, uniformity) from occurring depending on a position on the table 31. When multiple filaments 60 are disposed adjacent to each other in the vertical and front-rear directions in the chamber 2 as in the present embodiment, direct measurement of temperature of each of the filaments 60 using a conventional radiation thermometer is likely to cause measurement accuracy to deteriorate. Additionally, each of the filaments 60 has a small diameter. This causes measurement of infrared rays and electromagnetic waves emitted to be difficult, and measuring equipment to be expensive. In contrast, in the present embodiment, the amount of thermal expansion of each of the filaments 60 is calculated in accordance with output power of the heating power source 81, and the movable electrode 72 is moved in accordance with the amount of the thermal expansion. Thus, as compared with a case where temperature of each of the filaments 60 is directly measured, control variation is reduced, an attitude of each of the filaments 60 is stably maintained, and coating quality for each of the workpieces 5 is improved.

As described above, in the present embodiment, the filament cartridges 6A, 6B and 6C supporting the multiple filaments 60 are inserted into the chamber 2 through the opening 2H. At this time, the fixed electrode 71 and the movable electrode 72 guide each of the filament cartridges, so that each of the filament cartridges can be easily inserted into the chamber 2. The fixed electrode 71 and the movable electrode 72 also hold each of the filament cartridges in the chamber 2 so that the multiple filaments 60 face the corresponding multiple workpieces 5. This enables each of the multiple filaments 60 to be easily disposed at a coating treatment position inside the chamber 2. Additionally, when a part of the multiple filaments 60 is broken, the broken filament 60 can be easily removed by replacing the corresponding filament cartridge.

In the present embodiment, multiple filament cartridges can be easily attached inside the chamber 2 and detached from inside the chamber 2. The filaments 60 of each of the multiple filament cartridges are disposed at intervals in the vertical direction, so that a coating treatment space in which each of the workpieces 5 is insertable can be formed between the filaments 60 adjacent to each other in the front-rear direction.

In the present embodiment, even when the multiple filaments 60 are thermally expanded during the coating treatment, hanging down or deformation of the multiple filaments 60 can be prevented by changing a distance between the left frame 61 and the right frame 62 using the electrode drive unit 82. Each of the paired connecting members 63 of each filament cartridge has the telescopic portion 63H, so that the above deformation due to thermal expansion can be prevented while cartridge structure of the multiple filaments 60 is maintained.

In the present embodiment, when the workpieces 5 are inserted into the corresponding multiple support holes 4H of each of the workpiece support blocks 4, and the workpiece support blocks 4 are held on the table 31 of the stage 3, a coating treatment position of each of the workpieces 5 can be aligned with the corresponding one of the multiple filaments 60.

In the present embodiment, when the stage drive unit 83 moves the stage 3 in the vertical direction, each of the multiple workpieces 5 can be moved between the coating treatment position at which each of the multiple workpieces 5 is disposed close to the corresponding one of the multiple filaments 60, and a separation position disposed further apart from below the corresponding one of the multiple filaments 60 than the coating treatment position.

Although the hot filament CVD device 1 according to an embodiment of the present invention has been described above, the present invention is not limited to the embodiment. As the hot filament CVD device according to the present invention, the following modified embodiments are applicable.

(1) Although the above embodiment is described in which the first cartridge 6A, the second cartridge 6B, and the third cartridge 6C are inserted into the chamber 2 in the front-rear direction (arrow DS in FIG. 10) intersecting (orthogonal to) a direction (left-right direction) in which the multiple filaments 60 extend, each of the cartridges may be inserted into the chamber 2 in the direction in which the multiple filaments 60 extend. In this case, the fixed electrode 71 and the movable electrode 72 of FIG. 10 may be disposed on the front side and the rear side of the chamber 2, respectively. Any one of the electrodes to be disposed on the front side when each of the cartridges is attached or detached is desirably retracted downward or upward to prevent interference with attachment or detachment of each of the cartridges. The table 31 and each of the filament cartridges in the chamber 2 may be disposed in the vertical direction. That is, a structure in which the hot filament CVD device 1 in FIG. 1 is rotated 90 degrees around a horizontal axis may be used. The first cartridge 6A, the second cartridge 6B, and the third cartridge 6C may be each disposed with the filaments 60 each having a longitudinal direction intersecting (orthogonal to) a longitudinal direction of each of the workpiece support blocks 4.

(2) Although the above embodiment is described in which the fixed electrode 71 and the movable electrode 72 each include the holding part of the present invention, an electrode for applying voltage to the multiple filaments 60 may have another structure. In this case, paired holding parts each having an engaging recess 71H as in the above embodiment may be provided in the chamber 2, and voltage may be applied to each of the filaments 60 through a path different from the holding parts.

(3) Although the above embodiment is described in which the electrode drive unit 82 moves the movable electrode 72 in accordance with thermal expansion of the filaments 60, the present invention is not limited to this. The hot filament CVD device 1 may include only the cartridge structure of the filament electrode unit 6 without including a mechanism for moving the electrode (holding part). The workpiece support block 4 may be formed of one block placed on the table 31 without being divided into multiple blocks.

(4) Although the above embodiment is described in which when the movable electrode 72 is moved in accordance with thermal expansion of the multiple filaments 60, the amount of movement of the movable electrode 72 is calculated using Equation 1, the present invention is not limited to this. The amount of thermal expansion of each of the filaments 60 in accordance with output of the heating power source 81 and heating time (voltage application time) of each of the filaments 60 may be preliminarily measured in an experiment (experimental data) and stored in the storage unit 805. In this case, the drive control unit 802 (FIG. 5) may refer to the corresponding amount of thermal expansion stored in the storage unit 805 in accordance with the output and the heating time of the heating power source 81 during the actual coating treatment, to cause the movable electrode 72 to move in accordance with the corresponding amount of thermal expansion. Additionally, Equation 1 above and the experimental data may be combined to correct the amount of thermal expansion derived from Equation 1 using the experimental data, and movement control of the movable electrode 72, having higher accuracy of the thermal expansion of each of the filaments 60, may be performed.

The present invention provides a hot filament CVD device that performs coating treatment on multiple base materials. The hot filament CVD device includes: a chamber including a chamber body provided with an opening, and a door attached to the chamber body to seal the opening and allow the opening to be openable; a base material support disposed inside the chamber to support the multiple base materials; at least one filament cartridge insertable into the chamber through the opening in a predetermined insertion direction, the at least one filament cartridge including: multiple filaments that extend in a first direction and are disposed apart from each other in a second direction intersecting the first direction; a first frame that extends in the second direction and supports one end of each of the multiple filaments in the first direction; a second frame that extends in the second direction and supports another end of each of the multiple filaments in the first direction; and paired connecting members that connect opposite ends of the first frame in the second direction and corresponding opposite ends of the second frame in the second direction in the first direction; a power source that allows a current to flow into the multiple filaments; and a paired holding parts each having a shape for guiding the at least one filament cartridge in the insertion direction, the at least one filament cartridge being to be inserted into the chamber in the insertion direction through the opening, and for holding the at least one filament cartridge while allowing the multiple filaments to face the corresponding multiple base materials in a third direction intersecting a plane including the first direction and the second direction.

According to the present configuration, the filament cartridge supporting the multiple filaments is inserted into the chamber through the opening. At this time, the paired holding parts guide the filament cartridge, so that the filament cartridge can be easily inserted into the chamber. The paired holding parts hold the filament cartridge in the chamber so that the multiple filaments face the corresponding multiple base materials. This enables each of the multiple filaments to be easily disposed at a coating treatment position inside the chamber. Additionally, when a part of the multiple filaments is broken, the broken filament can be easily removed by replacing the corresponding filament cartridge.

The above configuration is desirably configured such that the at least one filament cartridge includes multiple filament cartridges, and the paired holding parts each have a shape guiding each of the multiple filament cartridges to be inserted into the chamber in the insertion direction, and holding the multiple filament cartridges allowing the multiple filaments provided in each of the multiple filament cartridges to be disposed at intervals in the third direction.

According to the present configuration, the multiple filament cartridges can be easily attached inside the chamber and detached from inside the chamber. The filaments of each of the multiple filament cartridges are disposed at intervals in the third direction, so that a coating treatment space in which each of the base materials is insertable can be formed between the filaments adjacent to each other in the second direction.

The above configuration is desirably configured such that the paired holding parts each have a shape for holding the first frame and the second frame, the hot filament CVD device further includes a holding part moving mechanism that moves at least one of the paired holding parts to change a distance between the first frame and the second frame in the first direction, and the paired connecting members each have a telescopic portion that is capable of being extended and contracted, allowing a change in distance between the first frame and the second frame.

According to this configuration, even when the multiple filaments are thermally expanded during the coating treatment, deformation of the multiple filaments can be prevented by changing the distance between the first frame and the second frame using the holding part moving mechanism. Each of the paired connecting members of each filament cartridge has the telescopic portion, so that the above deformation can be prevented while the cartridge structure of the multiple filaments is maintained.

The above configuration desirably further includes a stage that restricts a position of the base material support in each of the first direction and the second direction in the chamber, and holds the base material support, wherein the base material support opened with multiple holes into which the respective multiple base materials are allowed to be inserted, and opening positions of the respective multiple holes in the base material support are set to allow the multiple base materials to be disposed between the corresponding multiple filaments of the at least one filament cartridge held by the paired holding parts when viewed from the third direction.

According to the present configuration, when the base materials are inserted into the respective multiple holes of the base material support and the base material support is held on the stage, the multiple base materials can be aligned with the corresponding multiple filaments.

The above configuration desirably further includes a stage moving mechanism that moves the stage in the third direction to move the multiple base materials between a coating treatment position at which the multiple base materials are disposed close to the corresponding multiple filaments and a separation position further apart from the multiple filaments than the coating treatment position in the third direction.

According to the present configuration, when the stage moving mechanism moves the stage in the third direction, the multiple base materials can be moved between the coating treatment position and the separation position.

The invention claimed is:

1. A hot filament CVD device that performs coating treatment on multiple base materials, the hot filament CVD device comprising:

a chamber including a chamber body provided with an opening, and a door attached to the chamber body to seal the opening and allow the opening to be openable;

a base material support disposed inside the chamber to support the multiple base materials;

at least one filament cartridge insertable into the chamber through the opening in a predetermined insertion direction, the at least one filament cartridge including:

multiple filaments that extend in a first direction and are disposed apart from each other in a second direction intersecting the first direction;

a first frame that extends in the second direction and supports one end of each of the multiple filaments in the first direction;

a second frame that extends in the second direction and supports another end of each of the multiple filaments in the first direction; and two paired connecting members, each extending in the first direction, that connect opposite ends of the first frame in the second direction to corresponding opposite ends of the second frame in the second direction;

a power source that allows a current to flow into the multiple filaments; and two paired holding parts each having a recess for slidably engaging the at least one filament cartridge for guiding the at least one filament cartridge in the insertion direction, the at least one filament cartridge being inserted into the chamber in the insertion direction through the opening, and for holding the at least one filament cartridge while allowing the multiple filaments to face the corresponding multiple base materials in a third direction intersecting a plane including the first direction and the second direction.

2. The hot filament CVD device according to claim 1, wherein the at least one filament cartridge includes multiple filament cartridges, and the paired holding parts each have a shape guiding each of the multiple filament cartridges to be inserted into the chamber in the insertion direction, and holding the multiple filament cartridges allowing the multiple filaments provided in each of the multiple filament cartridges to be disposed at intervals in the third direction.

3. The hot filament CVD device according to claim 1, wherein the paired holding parts each have a shape for holding the first frame and the second frame, the hot filament CVD device further comprises a holding part moving mechanism that moves at least one of the paired holding parts to change a distance between the first frame and the second frame in the first direction, and the paired connecting members each have a telescopic portion that is capable of being extended and contracted, allowing a change in distance between the first frame and the second frame.

4. The hot filament CVD device according to claim 1, further comprising a stage that restricts a position of the base material support in each of the first direction and the second direction in the chamber, and holds the base material support, wherein the base material support opened with multiple holes into which the respective multiple base materials are allowed to be inserted, and opening positions of the respective multiple holes in the base material support are set to allow the multiple base materials to be disposed between the corresponding multiple filaments of the at least one filament cartridge held by the paired holding parts when viewed from the third direction.

5. The hot filament CVD device according to claim 4, further comprising a stage moving mechanism that moves the stage in the third direction to move the multiple base materials between a coating treatment position at which the multiple base materials are disposed close to the corresponding multiple filaments and a separation position further apart from the multiple filaments than the coating treatment position in the third direction.

* * * * *